United States Patent [19]

Kitaguchi

[11] Patent Number: 4,639,692

[45] Date of Patent: Jan. 27, 1987

[54] INTEGRATABLE SQUAREWAVE PULSE OSCILLATOR

[75] Inventor: Takahisa Kitaguchi, Tokyo, Japan

[73] Assignee: NEC Corporation, Japan

[21] Appl. No.: 742,052

[22] Filed: Jun. 6, 1985

[30] Foreign Application Priority Data

Jun. 11, 1984 [JP] Japan .................... 59-119395

[51] Int. Cl.$^4$ .............................................. H03K 3/26
[52] U.S. Cl. ...................................... 331/111; 331/143
[58] Field of Search ............... 331/108 R, 111, 143, 331/184

[56] References Cited

U.S. PATENT DOCUMENTS 4,359,649  11/1982  Mundel ........................... 331/111 X
4,377,790   3/1983  Zobel et al. ...................... 331/111
4,465,983   8/1984  Hogeboom ...................... 331/111

FOREIGN PATENT DOCUMENTS 2102231  1/1983  United Kingdom .............. 331/111

OTHER PUBLICATIONS

IEEE Journal of Solid-State Circuits, vol. SC-13, No. 6, 12/78, "A Low-Voltage IC Timer", by: Hans R. Camenzind, et al.

Primary Examiner—Eugene R. LaRoche
Assistant Examiner—Robert J. Pascal
Attorney, Agent, or Firm—Laff, Whitesel, Conte & Saret

[57] ABSTRACT

A simple oscillator circuit is capable of generating a plurality of frequencies that are completely independent of one another, any one of which frequencies can be freely selected. The oscillator may be used as part of an electronic ringer for a telephone, for example. The oscillator circuit includes a capacitor which is charged from a current source. A discharge constant current circuit discharges the charge from the capacitor. A comparator compares the charge voltage on the capacitor with a first or a second reference voltage. In response to the output of the comparator, a reference voltage switching control circuit supplies the first or second reference voltage to the comparator and controls the turning on and off of the discharge constant current circuit. A control constant current source controls the current from the charge current source for charging the capacitor. The frequency of the output signal from the comparator is controlled by regulating the control constant current source to switch the current capacity of the charge current source.

6 Claims, 6 Drawing Figures

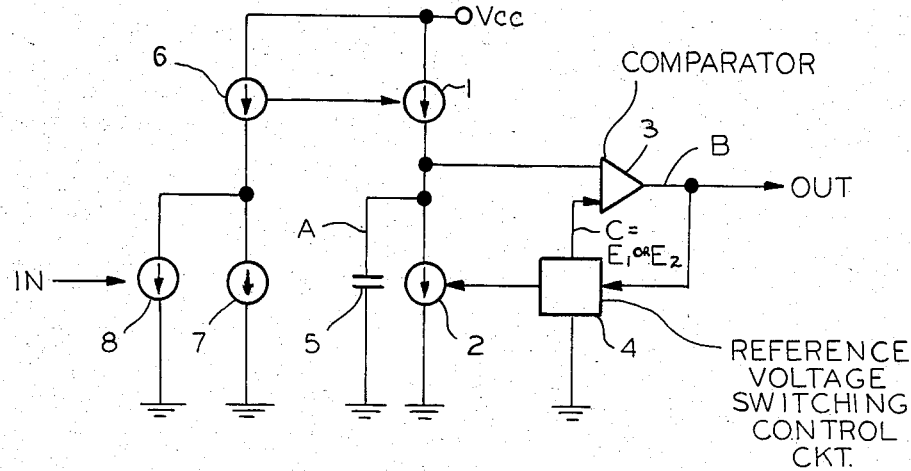
FIG.1
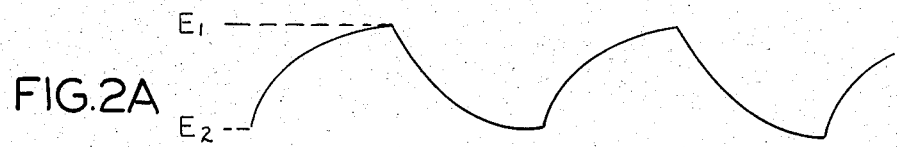
FIG.2A
FIG.2B
FIG.2C

INTEGRATABLE SQUAREWAVE PULSE OSCILLATOR

BACKGROUND OF THE INVENTION

The present invention relates to an oscillator circuit utilizing the charging and discharging of a capacitor, and more particularly to such a circuit having means for switching between different oscillating frequencies.

The present invention is also concerned with an oscillator circuit which is particularly suitable for use as a tone ringer of a telephone set which alternately generates a high frequency tone such as 1400 Hz and a low frequency tone such as 400 Hz.

A conventional oscillator circuit of this kind is enabled to alter the output frequency either by switching between the outputs of a plurality of oscillator circuits or by varying the time constant of one oscillator circuit. Switching between oscillator circuits has the disadvantage of complexity resulting from the increased number of circuits, because of the need for a plurality of oscillator circuits. The varying of a time constant has an inability to make the plurality of oscillating frequencies widely different from one another on account of the difficulty involved in setting the plurality of frequencies independent of one another and of the difficulty involved in varying the time constant over a wide range.

SUMMARY OF THE INVENTION

An object of the present invention, therefore, is to provide a simply structured oscillator circuit which is capable of oscillating at a plurality of frequencies that are completely independent of one another, any one of which frequencies can be freely selected.

According to the invention, an oscillator circuit includes a capacitor which is charged from a current source. A discharge constant current circuit discharges the charge from the capacitor. A comparator compares the charge voltage on the capacitor with a first or second reference voltage. A reference voltage switching control circuit supplies the first or second reference voltage, which is selected according to the output of the comparator, to the comparator and controls the turning on and off of the discharge constant current circuit. A constant current control source controls the current from the charge current source for charging the capacitor. The frequency of the output signal from the comparator is controlled by regulating the control constant current source to switch the current capacity of the charge current source.

BRIEF DESCRIPTION OF THE DRAWINGS

The present invention will be better understood from the following detailed description taken in conjunction with the accompanying drawings, in which:

FIG. 1 is a block diagram illustrating a preferred embodiment of the present invention;

FIGS. 2A, 2B and 2C are waveform diagrams representing the operation of the preferred embodiment;

DETAILED DESCRIPTION OF THE PREFERRED EMBODIMENT

Figure 3:
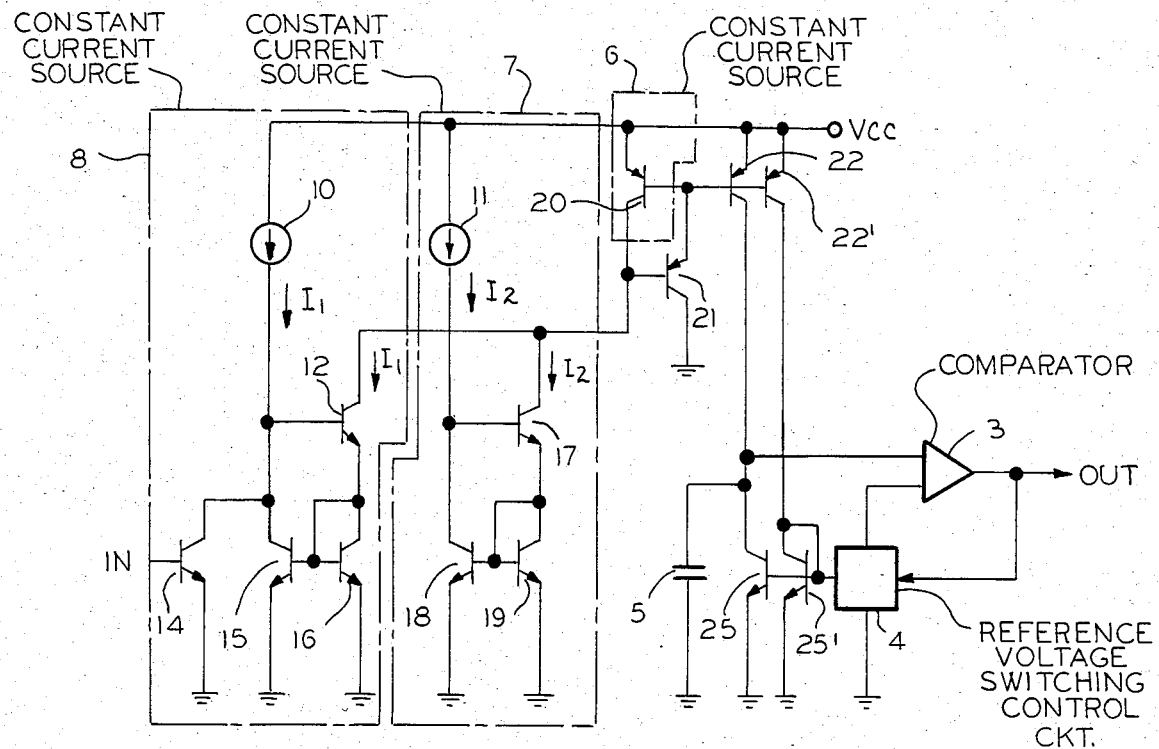
FIG. 3 is a detailed diagram of the circuit shown in FIG. 1.

A preferred embodiment of the present invention will be described in detail with reference to the accompanying drawings.

In FIG. 1, the preferred embodiment of the invention comprises a capacitor 5; a charge current source 1 for charging capacitor 5; a discharge constant current circuit 2 for discharging the capacitor 5; a comparator 3 for comparing the voltage charge on the capacitor 5 with a reference voltage C; a reference voltage switching control circuit 4 for supplying the reference voltage C which may be either a first reference voltage $E_1$ or a second reference voltage $E_2$ ($E_1 > E_2$), which is selected according to the output of the comparator 3. Control circuit 4 controls the turning on and off of the discharge constant current circuit 2 and constant current sources 6, 7 and 8 for controlling the oscillation frequency.

When the charge current source 1 charges capacitor 5 to the voltage of the first reference voltage $E_1$, as shown in FIG. 2A, the output B (FIG. 2B) of the comparator 3 rises to a high level. Responsive thereto the reference voltage switching control circuit 4 switches the reference voltage C (FIG. 2C) to the second reference voltage $E_2$ and turns on the discharge constant current circuit 2. In response to the turning on of the discharge constant current circuit 2, the capacitor 5 discharges. Its voltage eventually falls to the second reference voltage $E_2$, where the output of the comparator 3 is reversed to the low level. Thus, the reference voltage switching control circuit 4 switches the reference voltage C to the first reference voltage $E_1$ and turns off the discharge control current circuit 2. Accordingly, the oscillation in the output of the comparator 3 is at a frequency which is determined by the charge current and discharge current of the capacitor and by the first and second reference voltages.

The charge current source 1 is current mirror-coupled to the first constant current source 6. The current from the charge current source 1 is controlled by the first constant current source 6, to which flows a current that is the sum of the currents from the second constant current source 7 and the third constant current source 8. In response to the turning on or off of the third constant current source 8 by an input pulse (IN), the current flowing to the first constant current source 6 varies between two values. The current from the charge current source 1 which is used to charge the capacitor 5 varies the two values binarily. The discharge current of the discharge constant current circuit 2, which is interlocked with the charge current source 1, also varies binarily. Therefore, the output of the comparator 3 is made variable in two frequencies. Even if the discharge constant current circuit 2 were not interlocked with the charge current circuit 1, but if there were a fixed constant current source, for example, it would also be possible to make the oscillation frequency binarily variable. However, it is desirable, in order to make constant the duty factor of the oscillation output pulse, to so set the current flowing to the discharge constant current circuit 2 as to be a fixed multiple of the current from the charge current source 1. If, for example, the current flowing to the discharge constant current circuit 2 is set to be double the current from the charge current source 1, the duty factor of the output pulse will be 50%.

FIG. 3 is a detailed circuit diagram of the preferred embodiment of the present invention illustrated in FIG.

1, showing the constant current sources 1, 2, 6, 7 and 8, particularly. Referring to FIG. 3, the third constant current source 8 includes a circuit in which a constant current circuit 10 is connected in series with a transistor 15. A transistor 16 current mirror is coupled to the transistor 15. A transistor 12 has its emitter connected to the collector of the transistor 16. The collector of transistor 12 is connected to the collector of a PNP transistor 20. The base of transistor 12 is connected to the connection point between the constant current circuit 10 and the transistor 15. An input transistor 14 has a grounded emitter and a collector connected to the collector of transistor 15. To the collector of the transistor 12 flows the same current $I_1$ which flows to the constant current circuit 10. Since the control input pulse (IN) is supplied to the base of the transistor 14, the transistor 14 is turned on. Further, since the current of the constant current circuit 10 does not flow into the transistor 15, the currents of the transistors 16 and 12 will be reduced to zero.

The second constant current source 7 comprises a circuit in which a constant current circuit 11 is connected in series with a transistor 18. A transistor 19 is current mirror-coupled to the transistor 18. A transistor 17 is connected between the collector of the transistor 19 and the collector of the PNP transistor 20. The base of the transistor 17 is connected to the connection point between the constant current circuit 11 and the collector of the transistor 18. To the collector of the transistor 17 flows the same current $I_2$ which flows to the constant current circuit 11. All of the transistors 12 and 14 through 19 are NPN transistors.

The first constant current source 6 includes the PNP transistor 20 having an emitter connected to a positive power source and a collector connected to the collectors of the transistors 12 and 17 and to the base of a PNP transistor 21. The PNP transistor 21 is provided for the biasing purpose, and its collector is grounded. To the PNP transistor 20 flows a current which is the sum of the collector current $I_1$ of the transistor 12 and the collector current $I_2$ of the transistor 17. Therefore, a collector current of $I_1 + I_2$ normally flows thereto. The collector current of the transistor 20 becomes $I_2$ when the collector current of the transistor 12 is reduced to zero by the control pulse IN.

A PNP transistor 22, corresponding to the charge current source 1 in FIG. 1, is current mirror-coupled to the PNP transistor 20. Transistor 22 charges a capacitor 5 with the collector current which is equal to the current flowing to the PNP transistor 20.

Transistors 25, 22' and 25' make up a discharge constant current circuit. The transistor 22' is current mirror-coupled to the transistor 22 to allow its collector current to be equal to the collector current of the transistor 22. The transistor 25' whose base and collector are connected to each other is also current mirror-coupled to the transistor 25. Both the discharge current of the capacitor 5 and the collector current of the transistor 22 flow to the transistor 25 while the transistor 25 being turned on. Thus, it is requisite that, in order to generate the pulse oscillation signal B at the output of comparator 3, with a 50 percent duty ratio, the collector current of the transistor 25 become twice the collector current of the transistor 25'. Therefore, the base-emitter junction area of the transistor 25 is formed to be twice the base-emitter junction area of the transistor 25'.

The comparator 3 compares the voltage on the capacitor 5 with the first or second reference voltage $E_1$ or $E_2$ and produces a high level output if the voltage of the capacitor 5 is found higher, or a low level output if it is found lower than the reference voltage. The reference voltage switching control circuit 4 keeps the NPN transistor 25 switched off and supplies the first reference voltage $E_1$ to the comparator 3 when the output of the comparator 3 is at the low level. Then the capacitor 5 is placed in a charging state. When the output of the comparator 3 is at the high level, the reference voltage switching control circuit 4 supplies the second reference voltage $E_2$ to the comparator 3, and keeps the NPN transistor 25 switched on. Then the capacitor 5 is placed in a discharging state.

The charge current from the PNP transistor 22 which constitutes the constant charge current circuit and the discharge current of the NPN transistor 25 which constitutes the constant discharge current circuit are binarily varied by turning on and off the third constant current source 8 in response to the input control pulse (IN). In other words, the output oscillation frequency of the comparator 3 binarily varies depending upon whether or not the input control pulse (IN) is supplied.

When the oscillator shown in FIG. 3 is used for a tone ringer of a telephone set, the power which is provided at the terminal Vcc is an output of a rectifier circuit (not shown) which rectifies a ringing signal supplied from the telephone line. The input control pulse (IN) signal has a low repetition rate, such 1 sec. In response to this control pulse, the tone frequency of the ringer is alternately varied between a high and a low frequency.

Incidentally, if the oscillation frequency is to be varied ternarily, a fourth constant current source may be provided in parallel with the constant current sources 7 and 8 which determine the charge and discharge currents for the capacitor 5. The charge and discharge current values varied ternarily by turning on and off this fourth constant current source (not shown) in a response to a control pulse.

Figure 4:
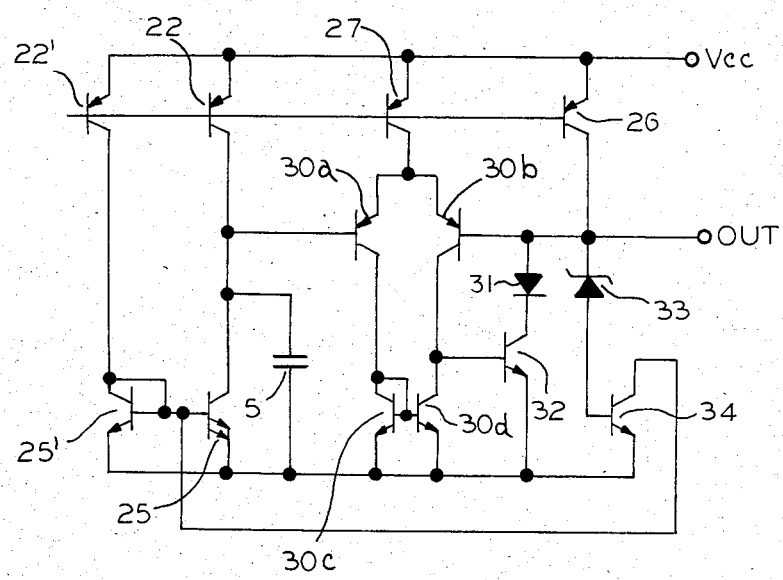
FIG. 4 is a circuit diagram mainly illustrating a comparator and a reference voltage switching control circuit for use in the embodiment shown in FIG. 1.

FIG. 4 illustrates in detail an example of the combination of the transistors 22, 22', 25 and 25', the comparator 3 and the reference voltage switching control circuit 4 for use in the circuit of FIG. 3. Transistors 30a, 30b, 30c and 30d constitute the comparator. A diode 31, a zener diode 33 and transistors 32 and 34 constitute the reference voltage switching control circuit.

The Zener diode 33 and the transistor 34 together function as a constant voltage source. The bases of the transistors 22 and 22' are connected to the transistors 20 and 21 in FIG. 3. Transistors 26 and 27 respectively bias the Zener diode 33 and transistors 30a through 30d, which constitute the comparator. Now, if the voltage of the capacitor 5 is smaller than the sum of the Zener voltage of the Zener diode 33 and the base-emitter voltage $V_{BE}$ of the transistor 34, the output transistor 30b will be cut off and the Zener diode 33 have the Zener voltage. Then the transistor 34 is turned on and the transistor 25 cut off. In this state, the capacitor 5 is charged by the transistor. When the voltage of the capacitor 5 has risen to reach the sum of the Zener voltage of the Zener diode 33 and the $V_{BE}$ of the transistor 34, the comparator's action is reversed to turn on the transistors 30b. Therefore, the transistor 32 is turned on, the Zener diode 33 and the transistor 34 are cut off, the transistor 25 is actuated, and the capacitor 5 discharged. As the terminal voltage of the capacitor 5 falls below the voltage between the anode of the diode 31 and the ground, the comparator's action is reversed again to cut off the transistor 30b.

As heretofore described, the present invention provides a structure to vary the charge and discharge currents of the oscillator circuit in accordance with an input control pulse, has the benefit of permitting a plurality of mutually independent oscillation frequencies to be obtained with a simple circuitry.

Those who are skilled in the art will readily perceive how to modify the invention. Therefore, the appended claims are to be construed to cover all equivalent structures which fall within the true scope and spirit of the invention.

What is claimed is:

1. An oscillator circuit comprising:
   a capacitor;
   a charge current source for charging the capacitor;
   a discharge constant current circuit for discharging said capacitor;
   a comparator for comparing the voltage of said capacitor when charged with a first or second reference voltage, said first and second reference voltages being upper and lower level voltages;
   said comparator comprising a first transistor having a base electrode connected to one terminal of the capacitor, a second transistor having a base electrode connected to the output terminal of the oscillator circuit and having an emitter electrode connected to an emitter electrode of the first transistor, two additional transistors having base electrodes connected to each other in a current mirror coupling, a collector of one of the additional transistors being connected to a base electrode of the other of the additional transistors and to a collector electrode of the first transistor, a collector electrode of the other of the additional transistors being connected to a collector electrode of the second transistor;
   a reference voltage switching control circuit for supplying to said comparator the first or second reference voltage in response to the output of said comparator, said reference voltages switching control means alternately and cyclically supplying the two reference voltages to cause said comparator to have an oscillating output, the supplied reference voltage controlling the turning on and off of said discharge constant current circuit whereby the oscillating frequency at the output of said comparator is determined by the charging and discharging current supplied to said capacitor;
   said switching control means comprising a third transistor having a base electrode connected to the collector of the other of the additional transistors, a diode connected between the output of the oscillator circuit and a collector of the third transistor, a fourth transistor having a collector electrode connected to the discharge constant current circuit, a Zener diode connected between the output of the oscillator circuit and a base electrode of the fourth transistor, emitters electrodes of the third and fourth transistors being grounded; and
   a control constant current source for controlling the current from said charge current source;
   wherein the output signal frequency of said comparator is controlled by regulating said control constant current source to switch the current capacity of said charge current source.

2. The oscillator of claim 1 wherein said charge current source further comprises a current mirror circuit coupled to said constant current source.

3. The oscillator of claim 2 wherein said constant current source is controlled responsive to input pulses, whereby the output signal frequency of the comparator may be varied in response to said input pulses.

4. The oscillator of claim 1 wherein said charge current source and said discharge current source are interlocked to alternately switch on and off in a binary manner.

5. The oscillator of claim 1 wherein said discharge constant current source has a current which is a fixed multiple of the current from the charge current source.

6. The oscillator of claim 5 wherein said discharge constant current source has a current which is twice the current from the charge current source.

* * * * *